United States Patent
Weisbuch et al.

[11] Patent Number: 5,081,634
[45] Date of Patent: Jan. 14, 1992

[54] QUANTUM WELL SEMICONDUCTOR LASER

[75] Inventors: Claude Weisbuch; Julien Nagle, both of Paris, France

[73] Assignee: Thomson-CSF, Puteaux, France

[21] Appl. No.: 547,040

[22] Filed: Jul. 2, 1990

[30] Foreign Application Priority Data

Jul. 4, 1989 [FR] France .................. 89 08965

[51] Int. Cl.$^5$ .............................................. H01S 3/19
[52] U.S. Cl. ................................................... 372/45
[58] Field of Search ................................. 372/44, 45

[56] References Cited

U.S. PATENT DOCUMENTS

| | | | |
|---|---|---|---|
| 4,860,297 | 8/1989 | Hayakawa et al. | 372/45 |
| 4,881,238 | 11/1989 | Chinone et al. | 372/45 |
| 4,905,246 | 2/1990 | Hayakawa et al. | 372/45 |
| 4,961,197 | 10/1990 | Tanaka et al. | 372/45 |

OTHER PUBLICATIONS

Applied Physics Letters, vol. 51, No. 4, Jul. 1987, pp. 209–211, New York, Y. Tokuda et al., "Lasing Wavelength of An Asymmetric Double Quantum Well Laser Diode", p. 209, FIG. 1.

IEEE Journal of Quantum Electronics, vol. QE-23, No. 6, Jun. 1987, pp. 696–703, New York, L. J. Mawst et al., "Optimization and Characterization of Index-Guided Visible AlGaAs/GaAs Graded Barrier Quantum Well Laser Diodes", Chapitre II, Fig. 1.

Applied Physics Letters, vol. 51, No. 2, Jul. 1987, pp. 78–80, New York, K. Uomi et al., "Ultrahigh Relaxation Oscillation Frequency (up to 30 GHz) of Highly P-Doped GaAs/GaA as Multiple Quantum Well Lasers", p. 78, Fig. 1.

Primary Examiner—James W. Davie
Attorney, Agent, or Firm—Oblon, Spivak, McClelland, Maier & Neustadt

[57] ABSTRACT

The quantum well semiconductor laser has at least one ultrafine layer with a thickness smaller than the critical thickness, the material of which is isoelectronic with that of the well.

16 Claims, 5 Drawing Sheets

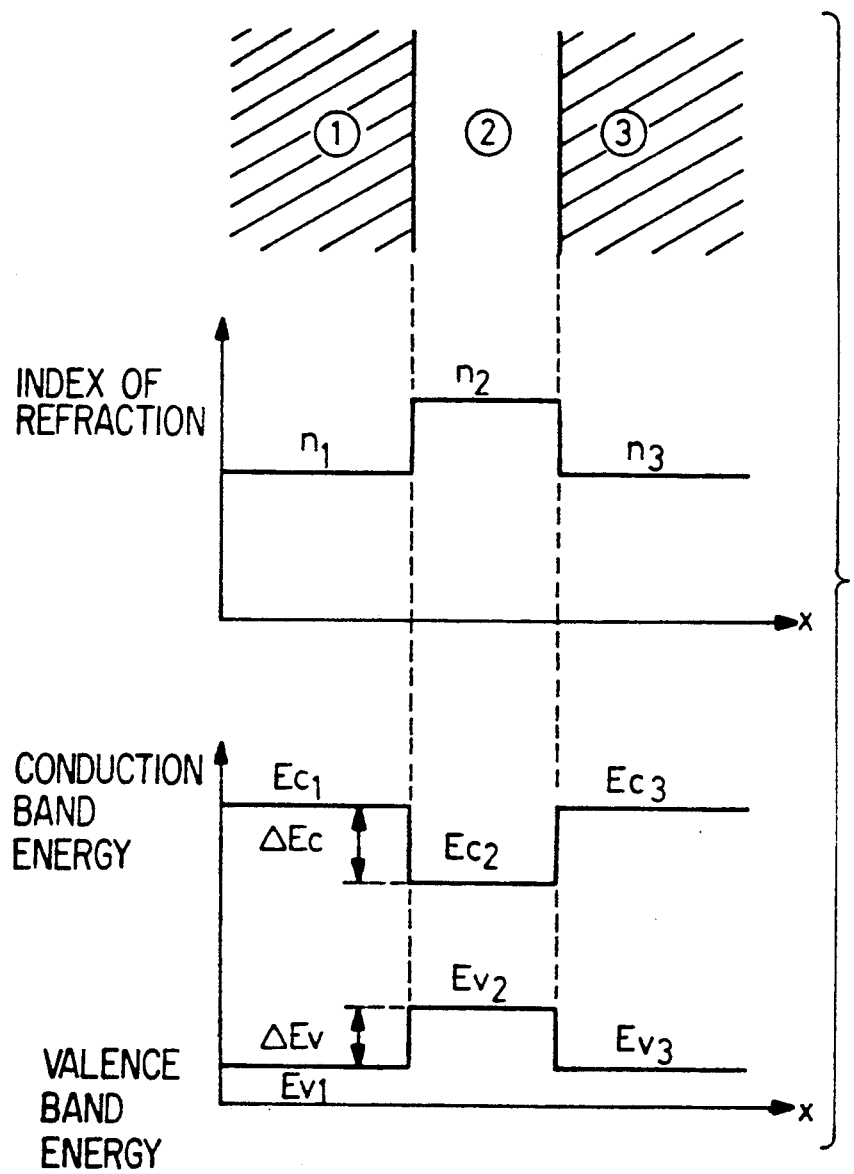
FIG_1

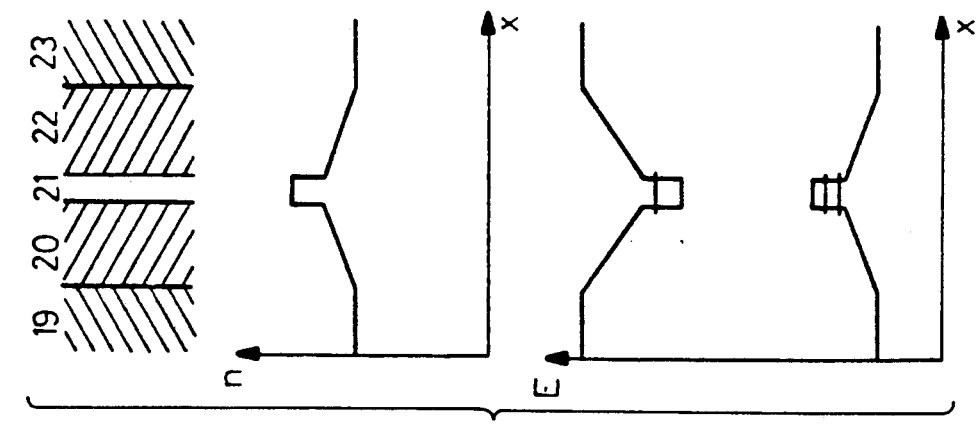
FIG_2d
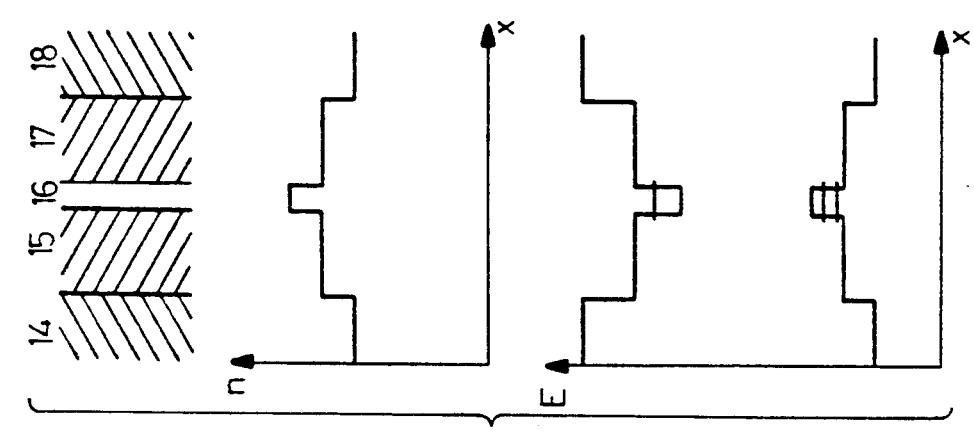
FIG_2c
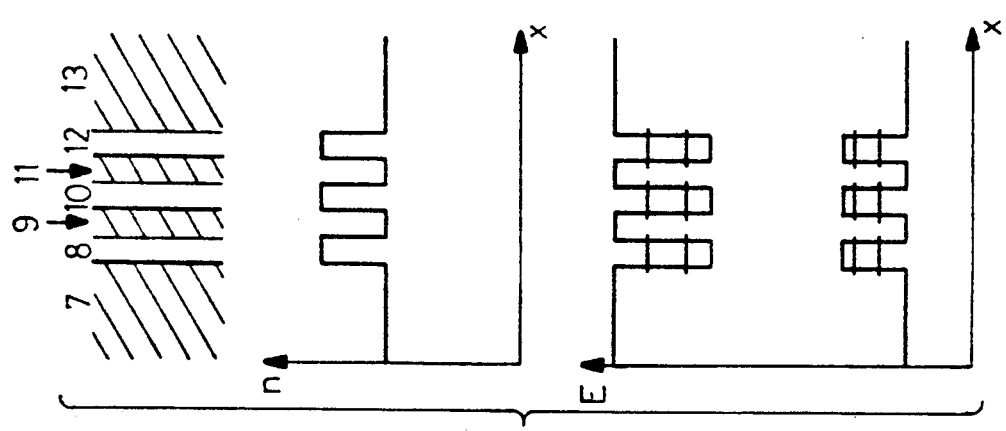
FIG_2b
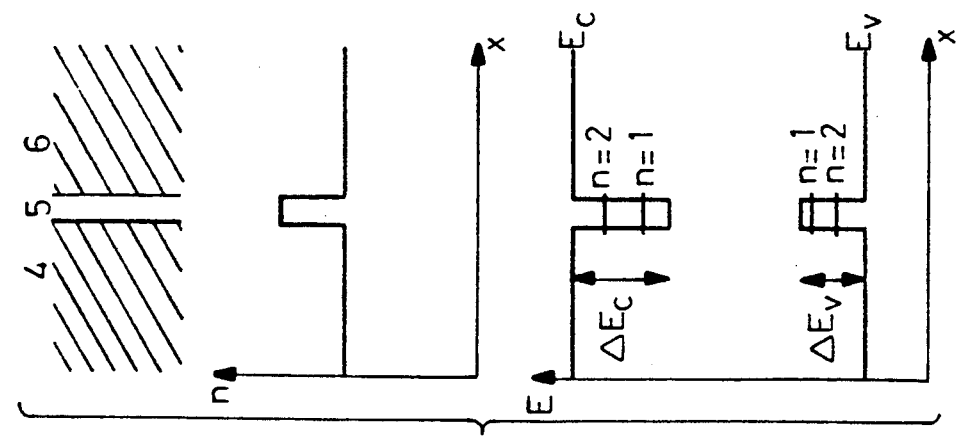
FIG_2a

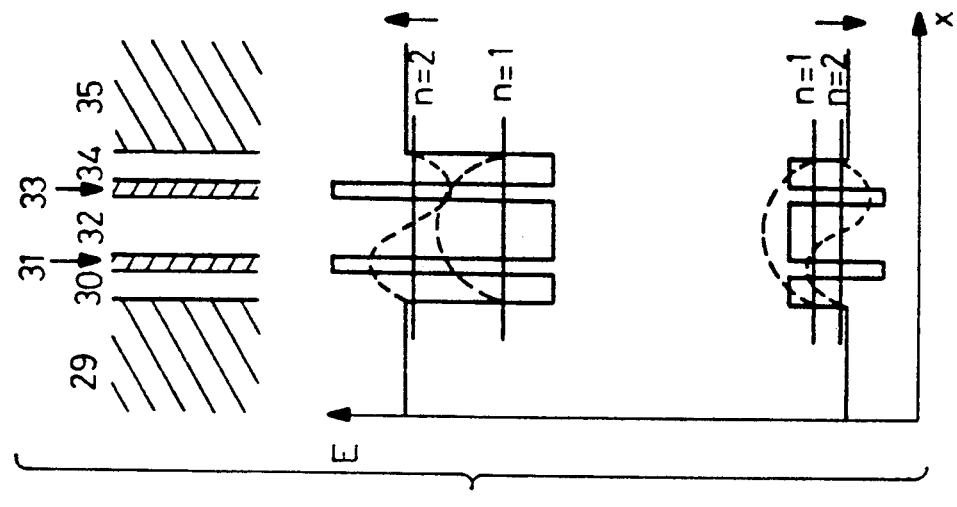
FIG_3a
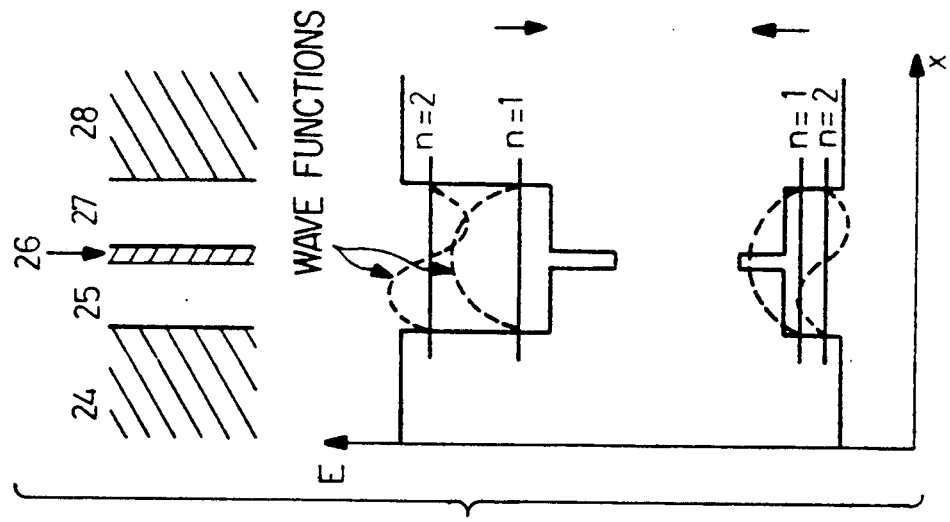
FIG_3b

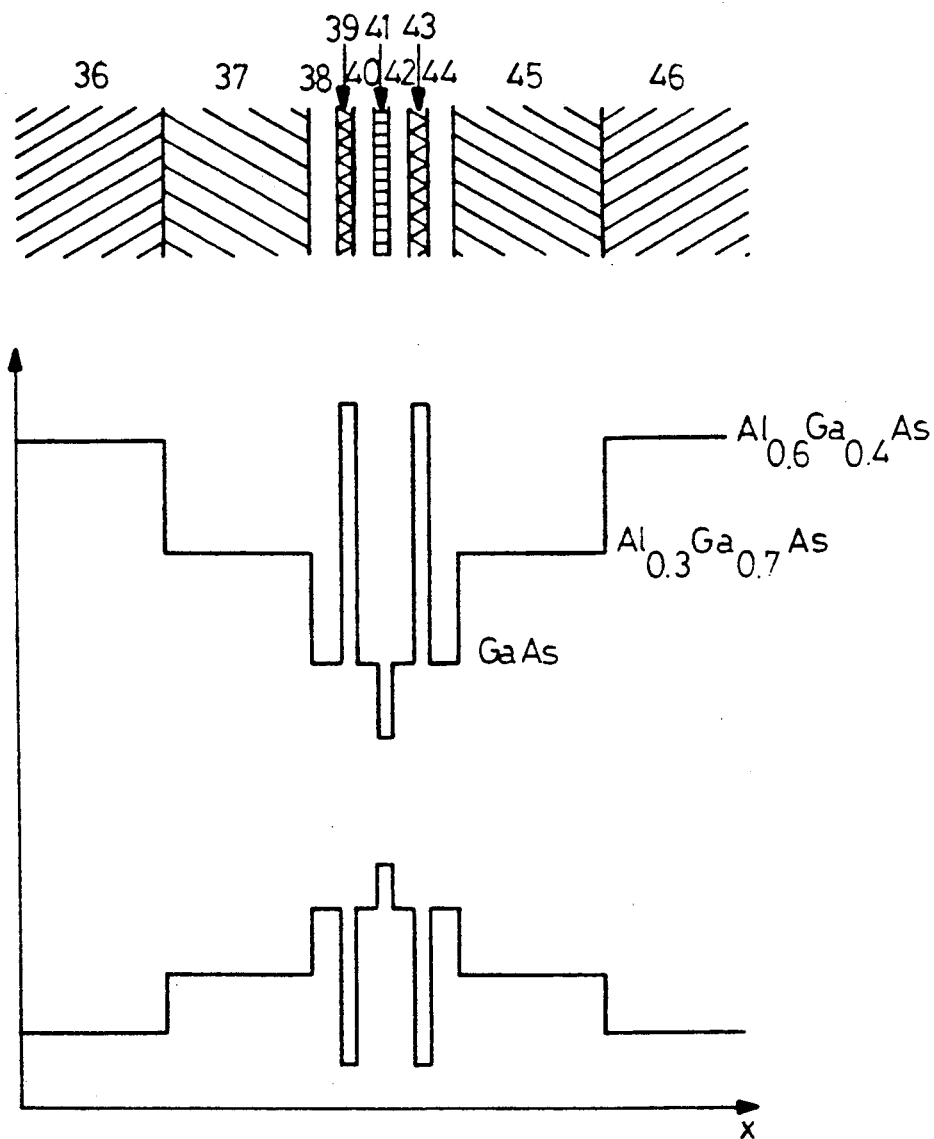
FIG_4

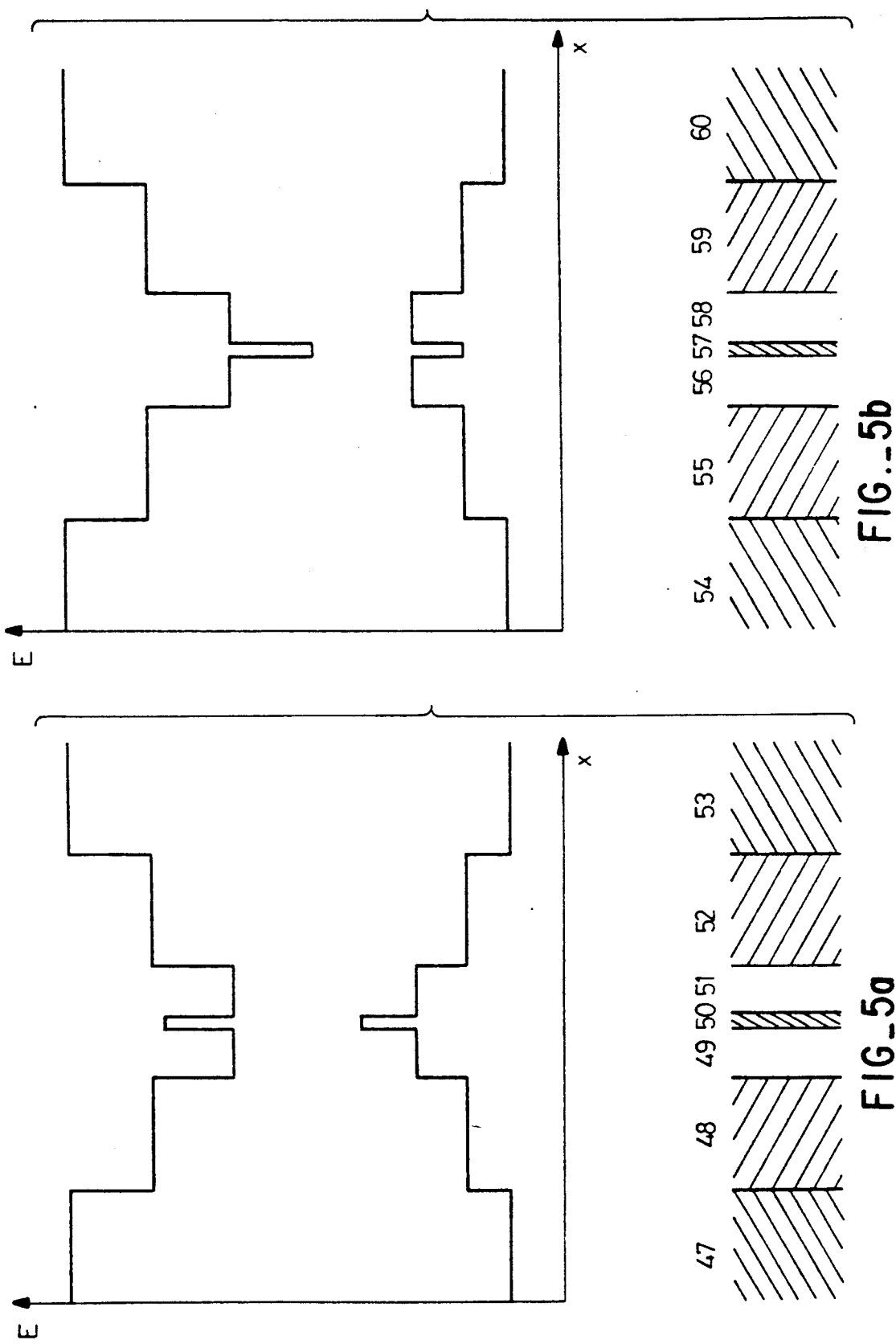

QUANTUM WELL SEMICONDUCTOR LASER

BACKGROUND OF THE INVENTION

1. Field of the Invention

The present invention pertains to a quantum well semiconductor laser.

2. Description of the Prior Art

The principle of semiconductor lasers is well known. The most commonly used structure is that of the double heterostructure laser. The structure, refraction index and energy levels of this type of laser are shown in FIG. 1. Through the optical confinement induced by the difference in index among the materials 1, 2 and 3 (n1 to n3 respectively), the optic wave of the laser is confined in a space that is smaller than the natural extension of the wave in a homogeneous medium. Through the discontinuities of the energy levels in the conduction band ($E_{c1}$ to $E_{c3}$) and the valence band ($E_{v1}$ to $E_{v3}$) the electrons and the holes are concentrated in the layer 2, which acts as the active medium of the laser in giving gain to the optic wave by induced recombination of the electron-hole pairs.

Quantum well lasers have recently been introduced, wherein the active layers 2 are narrow enough to give rise to quantum-related phenomena. It has been extensively demonstrated that, in appropriate applications, these lasers perform better than double heterostructure lasers. Four different embodiments of these quantum well lasers have been shown in FIGS. 2a-2d.

A detailed modelling of such lasers shows that two parameters play an essential role in limiting the performance characteristics of these lasers: the quantum wells $\Delta E_c$ and $\Delta E_v$ are not deep enough. The separations of energy between quantum levels $n=1$ and $n=2$ are not big enough, especially in the valence band, for the holes.

The latter parameter can be improved by using very thin wells. This would increase the difference between quantum levels. However, in this case, the levels all approach the upper edge of the quantum wells. This leads to an overflowing from these wells, when they are filled with electrons and holes by injection, and this overflowing makes them in fact useless.

The normal approach would use a material, for the wells of the semiconductor components, that has a very small forbidden band, hence with great energy band discontinuities $\Delta E_c$ and $\Delta E_v$, thus enabling the use of very thin layers without reaching the state of overflow described above. However, this method is impracticable for metallurgical reasons: materials that have big energy band differences between them generally have unequal crystal meshes. Under these conditions, when it is sought to make them grow by epitaxy, a great many dislocations are formed as soon as the thickness reaches what is known as a critical value. These numerous dislocations make the material unsuited to the operation of the laser.

An object of the present invention is a quantum well semiconductor laser that performs more efficiently than prior art lasers and is easy to make.

SUMMARY OF THE INVENTION

The quantum well semiconductor laser according to the invention has at least one ultrafine layer inserted between at least two layers of the quantum well, this (or these) ultrafine layer (or layers) being preferably made of a material that is isoelectronic with the material of the layers of the quantum well. The thickness of the ultrafine layers is that of one or more atomic monolayers and, in any case, it is smaller than the critical thickness. Advantageously, the material of the ultrafine layers or layers, like that of the layers of the quantum well, is of the III-V group.

BRIEF DESCRIPTION OF THE DRAWINGS

The present invention will be understood more clearly from the following detailed description of several embodiments, taken as non-restrictive examples and illustrated by the appended drawing, wherein:

FIG. 1, already mentioned above, is a simplified sectional view of the semiconductor layers of a known double heterostructure laser with corresponding graphs of refraction index, energy in the conduction band and energy in the valence band;

FIGS. 2a-2d, already mentioned above, represent simplified sectional views of the semiconductor layers of four quantum well lasers with corresponding graphs of refraction index, energy of the conduction band and energy of the valence band; and FIGS. 3a, 3b, 4, 5a and 5b sectional views of the semiconductor layers of two embodiments of a laser according to the invention with corresponding graphs of energy of the conduction band and energy of the valence band.

DESCRIPTION OF PREFERRED EMBODIMENTS

In the structure shown in FIG. 1, the layers of materials 1 and 3 often have the same chemical nature, except for dopant materials enabling the conductivities n and p to be obtained. The typical thickness of the layer 2 is between 1000 and 2000 Å.

The structures of FIGS. 2a-2d are respectively, those of a single quantum well structure, a multiple quantum well structure, a single quantum well laser with separate confinement and a single quantum well structure with separate optical confinement with gradient index through variable composition of the material of the optical cavity. Known variants (not shown) of the structures (c) and (d) relate to multiple quantum well structures with separate confinement.

In the structures of FIGS. 2a-2d, the layers 5, 8, 10, 12, 16, 21 play the role of the active medium and have a typical thickness of 30 to 200 Å.

FIGS. 3a and 3b show simple embodiments of two structures according to the invention. In FIG. 3a, the structure has an ultrafine layer 26 inserted into the center of the quantum well, between the layers 25, 27 forming this quantum well sandwiched by the barrier layers 24, 28. The ultrafine layer 26 lowers the level $n=1$ because the wave function $n=1$ interacts strongly with the ultrafine layer: if this ultrafine layer is a material which has conduction band and valence band levels that are lower than those of the material of the quantum well, the energy levels $n=1$ are lowered. By contrast, since the probability that the energy level $n=2$ will be present at the center of the quantum well is zero, as can be seen from the graphs of the wave functions in FIG. 3a, it is not affected by the presence of the ultrafine layer 26 which is really localized at the center of this well.

In the case of the embodiment of FIG. 3b, two ultrafine layers 31, 33 are inserted between the quantum well layers 30, 32 and 34, the whole structure being surrounded by barrier layers 29, 35.

In this example, the position of the ultrafine layers 31, 33 corresponds approximately to that of the maximum values of the wave function of the level n=2. This level can then be modified substantially by making a far smaller change in the position of the level n=1. It is possible, for example, to place an ultrafine layer of material having higher energy levels than those of the material forming the quantum well in order to raise the level n=2.

FIG. 4 shows an advantageous embodiment of the invention. The structure of FIG. 4 has first barrier layers 36, 46 and second barrier layers 37, 45 gripped by the first layers.

The quantum well is formed by four layers 38, 40, 42 and 44 separated by three ultrafine layers 39, 41, 43.

According to one embodiment, the layers 36 and 46 are made of $Al_{0.6}Ga_{0.4}As$ and the layers 37 and 45 are made of $Al_{0.3}Ga_{0.7}As$. The central layer 41 is made of InAs and the layers 39 and 43 are made of AlAs.

It has been computed that, in this embodiment, as compared with the single quantum well made of GaAs, the levels n=1 of electrons and holes are reduced by 7 meV and 48 meV respectively, while the levels n=2 of respectively for a layer 41 of InAs with a thickness of 3 Å and layers 39 and 43 of AlAs with a thickness of 1.5 Å each.

An additional beneficial effect is given by the strain induced by the atomic mesh difference of the materials. It further lowers the level of the heavy hole and raises the level of the light hole (for the most common example of a small-gap material having an atomic mesh that is greater than that of the material with a big gap). This leads to an increased difference among levels n=1 of heavy and light holes. The heavy hole level is then well separated from the heavy hole level n=2 by the effect of the disturbance and from the level n=1 by the strain.

Strain effects may also be added at will by using a quantum well material (layers 25-27, 30-32-34, 38-40-42-44 and 49-51 described above) under strain as compared with the optic confinement layers and with the substrate.

Depending on the effects sought, it is possible to use appropriate crystal orientations of growth, with the effects of difference of quantum levels and of strain varying greatly from one orientation to another. It is thus possible to make the levels of heavy holes and light holes coincide exactly. Under certain conditions, this would improve the properties of the laser.

Clearly, the above-mentioned chemical compositions and thicknesses of the layers are given purely by way of indication, and any other association of materials, in particular of isoelectronic materials, for the ultrafine layers and the quantum well layers is possible since the ultrafine nature of the layers inserted between the layers of quantum wells allows for their almost perfect epitaxial growth. Certain non-isoelectronic combinations may also be appropriate.

In the foregoing, we have described the exemplary case of the GaAs/GaAlAs laser. For lasers in the near infrared range, most often based on layers made of alloys of GaInAs, GaInAsP and InP, the optimization parameters may be different. Quantum well lasers are often limited by the thermodynamic population in electrons of the optical confinement layers (layers 15 and 16, FIG. 2c) because of the small difference in energy between the level n=1 of electrons of the well and the level of energy of electrons in these optic confinement layers. The parameter which it will then be sought to optimize will be this difference, and the materials most appropriate in this respect will be used for the ultrafine layer.

Since it is the levels of holes that it is most usually sought to separate, it is possible, if necessary, to take a material that would raise the level n=1 of electrons, because of levels of the conduction band that are higher than in the quantum well, but wherein a greater effect would occur in the valence band owing to a greater energy difference $\Delta E_v$ than in the examples described above.

FIGS. 5a and 5b show embodiments of this structure. The structure in FIG. 5a has external barrier layers 47, 53 and internal barrier layers 48, 52. An ultrafine layer 50 is inserted between two layers 49, 51 of the quantum well.

In FIG. 5b, we have a structure similar to that of FIG. 5a: external barrier layers 54, 60, internal barrier layers 55, 59, quantum well layers 56, 58 and ultrafine layer 57.

It is also possible to add layers according to the same principle to control the higher quantum levels, but this is generally unneccessary.

The ultrafine layers may be associated with atoms such as Si, Zn, Mg or Be atoms, in order to associate an effect of positioning of the Fermi level of the electrons or holes with the effect of control of the energy levels.

Since the layers are ultrafine, they have little influence on the confinement of the optic wave. They are therefore associated with structures where care has been taken to optimize this confinement, for example the structures of FIGS. 2b, 2c and 2d.

What is claimed is:

1. A quantum well semiconductor laser, comprising:
   two first semiconductor layers;
   at least two second semiconductor layers provided between said fist layers and forming one quantum well;
   at least one third ultrafine semiconductor layer provided between said second semiconductor layers and having a thickness of no greater than a few atomic monolayers;
   a resonant cavity including the first, second and third semiconductor layers; and
   a power source connected to said first layers.

2. A laser according to claim 1, wherein the ultrafine third layers are preferably made of a material that is isoelectronic with the material of the second layers.

3. A laser according to claim 1, wherein the thickness of the ultrafine third layers is smaller than the critical thickness above which numerous dislocations exist at the interface between the second and third layers.

4. A laser according to claim 3, wherein the material of the ultrafine third layers is of the III-V group.

5. A laser according to claim 1, wherein dopant atoms chosen from among Si, Zn, Mg, Be are added to the ultrafine third layers.

6. A laser according to claim 1, with one ultrafine third layer, and two second layers of equal thickness.

7. A laser according to claim 1, with two ultrafine third layers, wherein the layers are positioned approximately at the position of the maximum values of the wave functions of the level n=2.

8. A laser according to claim 1, with three ultrafine third layers, wherein the central third layer is made of InAs and the other two are made of AlAs.

9. A laser according to claim 1, having a single quantum well structure with separate confinement.

10. A laser according to claim 1, having a single quantum well structure with separate optical confinement with index gradient through variable composition of the material of the optical cavity.

11. A laser according to claim 1, having a multiple quantum well structure with separate confinement.

12. A laser according to claim 1, having a multiple quantum well structure with separate optical confinement with index gradient through variable composition of the material of the optical cavity.

13. The laser according to claim 1, wherein said first layer is between 1000 and 2000 Å.

14. The laser according to claim 1, wherein said second layers have a thickness of 30 to 200 Å.

15. A laser according to claim 1, wherein a first one of the ultrafine layers is at a symmetrical center of the laser structure and has a thickness of 3Å, and two other ultrafine layers are at symmetrically opposite sides of the symmetrical center and have a thickness of 1.5Å.

16. A quantum well semiconductor laser, comprising:

first layers composed of a first semiconductor material with a first band gap;

second layers composed of a second semiconductor material, which is isoelectronic to said first material, with a second band gap which is larger than said first band gap, said first layers being between said second layers, thereby defining one quantum well having localized wave functions, each wave function characterized by an energy level of said one quantum well and a quantum number n of said one quantum well, wherein at least $n=1$ and $n=2$ energy levels exist in said well;

at least one third ultrafine layer having a thickness which is less than the thickness of the quantum well and a position within said quantum well, whereby said third layer perturbs at least one of said localized wave functions more strongly than at least one other localized wave function;

means to populate optically radiative states in said quantum well; and resonant cavity means positioned to provide optical gain from said radiative states.

* * * * *